(12) United States Patent
Yanagihara et al.

(10) Patent No.: US 7,612,426 B2
(45) Date of Patent: Nov. 3, 2009

(54) SCHOTTKY BARRIER DIODE AND DIODE ARRAY

(75) Inventors: Manabu Yanagihara, Osaka (JP);
Yasuhiro Uemoto, Shiga (JP); Tsuyoshi Tanaka, Osaka (JP); Daisuke Ueda, Osaka (JP)

(73) Assignee: Panasonic Corporation, Osaka (JP)

( * ) Notice: Subject to any disclaimer, the term of this patent is extended or adjusted under 35 U.S.C. 154(b) by 78 days.

(21) Appl. No.: 11/272,878

(22) Filed: Nov. 15, 2005

(65) Prior Publication Data

US 2006/0108659 A1 May 25, 2006

(30) Foreign Application Priority Data

Nov. 25, 2004 (JP) .............................. 2004-340531

(51) Int. Cl.
*H01L 29/872* (2006.01)

(52) U.S. Cl. .................. 257/472; 257/471; 257/473; 257/475; 257/476; 257/480; 257/483; 257/484; 257/485; 257/486; 257/E27.068; 257/E29.338

(58) Field of Classification Search ......... 257/471–473, 257/910, 475–476, 480, 483–486, E27.068, 257/E29.338
See application file for complete search history.

(56) References Cited

U.S. PATENT DOCUMENTS

| | | | |
|---|---|---|---|
| 6,501,145 B1 | 12/2002 | Kaminski et al. | |
| 6,787,825 B1 * | 9/2004 | Gudesen et al. | ............. 257/278 |
| 7,078,743 B2 * | 7/2006 | Murata et al. | ............... 257/192 |
| 2005/0145883 A1 * | 7/2005 | Beach et al. | ................. 257/194 |
| 2006/0170003 A1 * | 8/2006 | Saito et al. | .................. 257/189 |

FOREIGN PATENT DOCUMENTS

| | | | |
|---|---|---|---|
| JP | 62244177 A | * | 10/1987 |
| JP | 11-354817 | | 12/1999 |
| JP | 2000-208813 A | | 7/2000 |
| JP | 2003-060212 A | | 2/2003 |
| JP | 2003-229566 A | | 8/2003 |
| JP | 2003-282863 A | | 10/2003 |
| JP | 2004-031896 A | | 1/2004 |

OTHER PUBLICATIONS

Starikov et al., Metal—insulator—semiconductor Schottky barrier structures fabricated using interfacial BN layers grown on GaN and SiC for optoelectronic device applications, J. Vac. Sci. Tech. A 17, 1235-1238, 1999.*
Eftekhari, Electrical characteristics of selenium-treated GaAs MIS Schottky diodes, Semicond. Sci. 8, 409-411, 1993.*

* cited by examiner

*Primary Examiner*—Kiesha L. Rose
*Assistant Examiner*—Minchul Yang
(74) *Attorney, Agent, or Firm*—McDermott Will & Emery LLP

(57) ABSTRACT

A Schottky barrier diode includes a first semiconductor layer and a second semiconductor layer successively formed above a semiconductor substrate with a buffer layer formed between the first and second semiconductor layers and the semiconductor substrate. A Schottky electrode and an ohmic electrode spaced from each other are formed on the second semiconductor layer, and a back face electrode is formed on the back face of the semiconductor substrate. The Schottky electrode or the ohmic electrode is electrically connected to the back face electrode through a via penetrating through at least the buffer layer.

28 Claims, 15 Drawing Sheets

SCHOTTKY BARRIER DIODE AND DIODE ARRAY

CROSS-REFERENCE TO RELATED APPLICATIONS

This application claims priority under 35 U.S.C. §119 on Patent Application No. 2004-340531 filed in Japan on Nov. 25, 2004, the entire contents of which are hereby incorporated by reference.

BACKGROUND OF THE INVENTION

The present invention relates to a Schottky barrier diode and a diode array, and more particularly, it relates to a Schottky barrier diode and a diode array using a two-dimensional electron gas.

A Schottky barrier diode (SBD) is required to have a high breakdown voltage and low on resistance. In order to realize a high breakdown voltage in a conventional SBD using a silicon (Si) material, the thickness of a drift layer where a depletion layer extends in applying a backward bias voltage is increased and a carrier concentration is lowered. The drift layer is, however, a region where electrons pass in applying a forward bias voltage, and hence, the on resistance of the SBD is increased when the thickness of the drift layer is increased and the carrier concentration is lowered.

An SBD using a nitride semiconductor material such as gallium nitride (GaN) is regarded as a promising SBD with a high breakdown voltage and low on resistance. Since a nitride semiconductor material has a high breakdown field strength, a high breakdown voltage can be attained even when the thickness of a drift layer is decreased, and therefore, such an SBD attains a high breakdown voltage and low on resistance. Now, conventional SBDs using a nitride semiconductor material will be described.

CONVENTIONAL EXAMPLE 1

FIG. 17 shows the cross-sectional structure of an SBD using a nitride semiconductor material according to Conventional Example 1 (see, for example, Japanese Laid-Open Patent Publication No. 2003-60212). As shown in FIG. 17, a buffer layer 103 made of aluminum nitride (AlN) or a superlattice structure of AlN and GaN is formed on an n-type silicon (n$^+$-Si) substrate 102, and an n-type GaN layer 104 is formed on the buffer layer 103. A Schottky electrode (anode) 105 is formed on the n-type GaN layer 104, and an ohmic electrode (cathode) 101 is formed on the back face of the substrate 102.

In the case where a backward bias voltage is applied to this SBD, a depletion layer extends in the n-type GaN layer 104, and hence the SBD attains a high breakdown voltage. Alternatively, in the case where a forward bias voltage is applied, electrons flow from the ohmic electrode 101 through the buffer layer 103 and the n-type GaN layer 104 to the Schottky electrode 105.

CONVENTIONAL EXAMPLE 2

FIG. 18 shows the cross-sectional structure of an SBD using a nitride semiconductor material according to Conventional Example 2 (see, for example, Japanese Laid-Open Patent Publication No. 2004-31896). As shown in FIG. 18, a buffer layer 112 of AlN is formed on a sapphire substrate 111, and an undoped GaN layer 113 and an undoped AlGaN layer 114 are formed on the buffer layer 112. A Schottky electrode 115 and an ohmic electrode 116 are formed on the AlGaN layer 114 to be spaced from each other. Since charges are induced onto the interface between the GaN layer 113 and the AlGaN layer 114 due to piezo polarization and spontaneous polarization, a two-dimensional electron gas with a high concentration of a density of approximately $10^{13}$ cm$^{-2}$ is formed on the interface. When a forward bias voltage is applied to this SBD, electrons flow in a horizontal direction to the sapphire substrate 111 owing to the two-dimensional electron gas (2DEG) formed on the interface between the GaN layer 113 and the AlGaN layer 114.

The SBD of Conventional Example 1 has, however, a problem that the on resistance cannot be sufficiently lowered. Since a two-dimensional electron gas is not used in Conventional Example 1, the mobility of electrons is approximately 900 cm$^2$/Vs, which is low as compared with the mobility of 1500 cm$^2$/Vs attained by using a two-dimensional electron gas, and hence the on resistance is not sufficiently lowered.

Also, the buffer layer 103 of Conventional Example 1 is provided for relaxing a difference in the lattice constant between Si crystal and GaN crystal, and this layer is a barrier for electrons with a superlattice structure. Furthermore, since a large number of crystal defects derived from the difference in the lattice constant between the crystal of the buffer layer 103 and the n$^+$-Si substrate 102 are present in the buffer layer 103, the buffer layer 103 has very high resistance. Therefore, a forward current should be allowed to flow from the Schottky electrode to the ohmic electrode through the buffer layer 103 with high resistance in Conventional Example 1, and hence, the on resistance is further increased.

In Conventional Example 2, the Schottky electrode 115 and the ohmic electrode 116 are both formed on the AlGaN layer 114, and a forward current is allowed to flow owing to the two-dimensional electron gas formed on the interface between the GaN layer 113 and the AlGaN layer 114. Accordingly, the mobility of electrons is high because the two-dimensional electron gas is used, and the on resistance can be sufficiently lowered. In addition, the increase of the on resistance derived from the buffer layer with high resistance can be avoided.

Since both the Schottky electrode and the ohmic electrode are formed above the top face of the substrate, however, wire bonding pads used for drawing electric signals from these electrodes should be formed above the top face of the substrate. An SBD is generally cut into a chip to be mounted on a substrate of a device. Therefore, in the case where the bonding pads of both the Schottky electrode and the ohmic electrode are formed on the same face, the occupied area of the chip is increased by several tens %. As a result, the size of the whole device is increased and the cost is also disadvantageously increased.

Moreover, in both of Conventional Examples 1 and 2, when a backward bias voltage is applied, the depletion layer extends to an edge of the chip where a large number of crystal defects are present due to mechanical damage caused in dicing process. Therefore, electric field concentration is caused in the edge of the chip, resulting in disadvantageously lowering the breakdown voltage of the SBD.

SUMMARY OF THE INVENTION

An object of the invention is realizing a Schottky barrier diode having a high breakdown voltage, low on resistance and a small chip area by overcoming the aforementioned conventional disadvantages.

In order to achieve the object, the Schottky barrier diode of this invention includes a buffer layer provided with a via penetrating therethrough.

Specifically, the Schottky barrier diode of this invention includes a first semiconductor layer and a second semiconductor layer successively formed above a semiconductor substrate with a buffer layer disposed between the first and second semiconductor layers and the semiconductor substrate; a Schottky electrode and an ohmic electrode spaced from each other and formed on the second semiconductor layer; and a back face electrode formed on a back face of the semiconductor substrate, and the Schottky electrode or the ohmic electrode is electrically connected to the back face electrode through a via penetrating through at least the buffer layer.

In the Schottky barrier diode of this invention, a forward current flows owing to a two-dimensional electron gas and no current flows in the buffer layer with high resistance. Therefore, although an electrode is provided on the back face of the substrate, the on resistance is not increased. As a result, the Schottky barrier diode attains both low on resistance and a small chip area.

In the Schottky barrier diode of the invention, the buffer layer preferably has higher resistance than the semiconductor substrate.

In the Schottky barrier diode of the invention, the via preferably penetrates through the semiconductor substrate. Thus, the on resistance of the Schottky barrier diode can be further lowered.

In the Schottky barrier diode of the invention, the via preferably does not penetrate through the semiconductor substrate. Thus, the via can be easily formed.

In the Schottky barrier diode of the invention, the Schottky electrode preferably surrounds the ohmic electrode. Thus, the length of the Schottky electrode can be increased without increasing the area occupied by a chip of the SBD, and hence, the Schottky barrier diode attains a high breakdown voltage.

In this case, it is preferred that the ohmic electrode is in a circular shape in a plan view and that a side of the Schottky electrode opposing the ohmic electrode is in a circular shape. Alternatively, the ohmic electrode may be in a rectangular shape in a plan view with sides of the Schottky electrode opposing the ohmic electrode being in a rectangular shape, or the ohmic electrode may be in a hexagonal shape in a plan view with sides of the Schottky electrode opposing the ohmic electrode being in a hexagonal shape.

Also in this case, a plan shape of an outer circumference of the Schottky electrode is preferably similar to a plan shape of an inner circumference of the Schottky electrode. Thus, a region where electric operations are ununiform can be reduced. Also, the Schottky electrode may have at least one cut portion. Thus, the Schottky electrode can be easily formed.

In the Schottky barrier diode of the invention, a high-resistance region surrounding the Schottky electrode and having higher resistance than the first semiconductor layer and the second semiconductor layer is preferably formed on a side of the Schottky electrode not opposing the ohmic electrode. Thus, a depletion layer can be prevented from extending to an edge with poor crystallinity of the chip, so as to increase the breakdown voltage of the Schottky barrier diode.

The Schottky barrier diode of the invention preferably further includes a first insulating film formed on the Schottky electrode and the ohmic electrode; and a drawing electrode drawn onto the first insulating film, and one of the Schottky electrode and the ohmic electrode not electrically connected to the back face electrode is preferably electrically connected to the drawing electrode. Thus, since the drawing electrode can be used as a bonding pad, the area occupied by the chip can be further reduced. Also, since an effect similar to a field plate effect attained in a field effect transistor can be attained, the breakdown voltage of the Schottky barrier diode can be increased.

In the Schottky barrier diode of the invention, the ohmic electrode is preferably electrically connected to the back face electrode. Alternatively, the Schottky electrode may be electrically connected to the back face electrode with a second insulating film formed on an inner wall of the via.

In the Schottky barrier diode of the invention, the semiconductor substrate is preferably made of silicon, silicon carbide or gallium nitride. Also, each of the first semiconductor layer and the second semiconductor layer is preferably made of a compound represented by a general formula, $In_aGa_bAl_cB_dN$, wherein $0 \leq a, b, c, d \leq 1$ and $a+b+c+d=1$, and the second semiconductor layer preferably has a larger band gap than the first semiconductor layer.

The diode array of this invention includes a plurality of Schottky barrier diodes formed on one semiconductor substrate and connected to one another in parallel, and the plurality of Schottky barrier diodes include a first semiconductor layer and a second semiconductor layer successively formed above the semiconductor substrate with a buffer layer disposed between the first and second semiconductor layers and the semiconductor substrate; a plurality of electrode pairs each corresponding to a pair of a Schottky electrode and an ohmic electrode formed on the second semiconductor layer and spaced from each other; a first insulating film formed on the second semiconductor layer for covering the plurality of electrode pairs; a drawing electrode formed on the first insulating film; and a back face electrode formed on a back face of the semiconductor substrate, and one of the Schottky electrode and the ohmic electrode of each of the plurality of electrode pairs is electrically connected to the back face electrode through a via penetrating through at least the buffer layer, and the other of the Schottky electrode and the ohmic electrode of each of the plurality of electrode pairs is electrically connected to the drawing electrode.

In the diode array of this invention, at least one of the Schottky electrode and the ohmic electrode in each of the plural electrode pairs is electrically connected to the back face electrode through the via penetrating through at least the buffer layer, and the other of the Schottky electrode and the ohmic electrode in each of the plural electrode pairs is electrically connected to the drawing electrode. Therefore, since the Schottky barrier diodes with low on resistance are operated in parallel, the on resistance can be reduced while increasing the breakdown voltage. Also, since the Schottky electrode and the ohmic electrode are provided on the difference faces of the substrate, the occupied area can be small.

In the diode array of the invention, the Schottky electrode preferably surrounds the ohmic electrode in each of the plurality of electrode pairs. Thus, the length of the Schottky electrode can be increased without increasing the area occupied by a chip of the diode array.

In the diode array of the invention, it is preferred that the ohmic electrode is in a circular shape in a plan view and that a side of the Schottky electrode opposing the ohmic electrode is in a circular shape in each of the plurality of electrode pairs. Alternatively, the ohmic electrode may be in a rectangular shape in a plan view with sides of the Schottky electrode opposing the ohmic electrode being in a rectangular shape in each of the plurality of electrode pairs, or the ohmic electrode may be in a hexagonal shape in a plan view with sides of the Schottky electrode opposing the ohmic electrode being in a hexagonal shape in each of the plurality of electrode pairs.

Thus, the Schottky barrier diodes included in the diode array can be two-dimensionally arranged without leaving any space between them.

In this case, a plan shape of an outer circumference of the Schottky electrode is preferably similar to a plan shape of an inner circumference of the Schottky electrode in each of the plurality of electrode pairs. Thus, a region where electric operations are ununiform can be reduced. Also, each Schottky electrode may have at least one cut portion. Thus, the Schottky electrode can be easily formed.

In the diode array of the invention, adjacent ones of the plurality of Schottky barrier diodes are preferably in contact with each other. Thus, the occupied area can be reduced.

In the diode array of the invention, a region where the plurality of Schottky barrier diodes are disposed is preferably surrounded with a high-resistance region having higher resistance than the first semiconductor layer and the second semiconductor layer. Thus, a depletion layer can be prevented from extending to an edge of the chip, resulting in increasing the breakdown voltage.

In the diode array of the invention, the semiconductor substrate is preferably made of silicon, silicon carbide or gallium nitride. Also, each of the first semiconductor layer and the second semiconductor layer is preferably made of a compound represented by a general formula, $In_aGa_bAl_cB_dN$, wherein $0 \leq a, b, c, d \leq 1$ and $a+b+c+d=1$, and the second semiconductor layer preferably has a larger band gap than the first semiconductor layer. Thus, a diode array with low on resistance can be definitely realized.

As described above, in the Schottky barrier diode and the diode array of this invention, the breakdown voltage is high, the on resistance is low and the chip area is small.

BRIEF DESCRIPTION OF THE DRAWINGS

FIGS. 1A and 1B are diagrams of a Schottky barrier diode according to Embodiment 1 of the invention wherein FIG. 1A is a plan view thereof and FIG. 1B is a cross-sectional view thereof taken on line Ib-Ib of FIG. 1A;

FIGS. 5A and 5B are diagrams of a Schottky barrier diode according to Embodiment 2 of the invention, wherein FIG. 5A is a plan view thereof and FIG. 5B is a cross-sectional view thereof taken on line Vb-Vb of FIG. 5A;

FIGS. 7A and 7B are diagrams of a Schottky barrier diode according to a modification of Embodiment 2, wherein FIG. 7A is a plan view thereof and FIG. 7B is a cross-sectional view thereof taken on line VIIb-VIIb of FIG. 7A;

FIGS. 13A and 13B are diagrams of a diode array according to Embodiment 5 of the invention, wherein FIG. 13A is a plan view thereof and FIG. 13B is a cross-sectional view thereof taken on line XIIIb-XIIIb of FIG. 13A;

DETAILED DESCRIPTION OF THE INVENTION

Embodiment 1

Figure 1A:
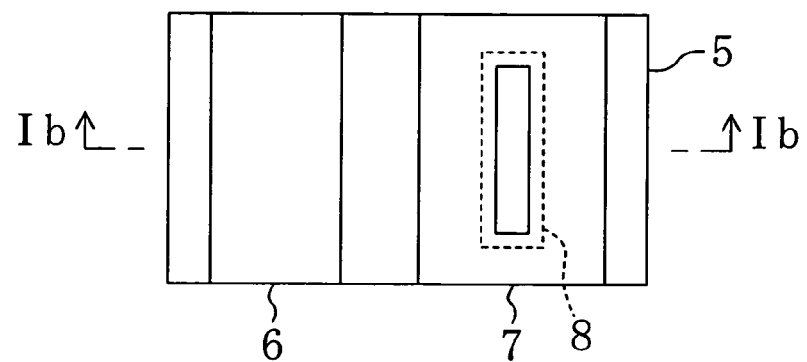
Figure 1B:
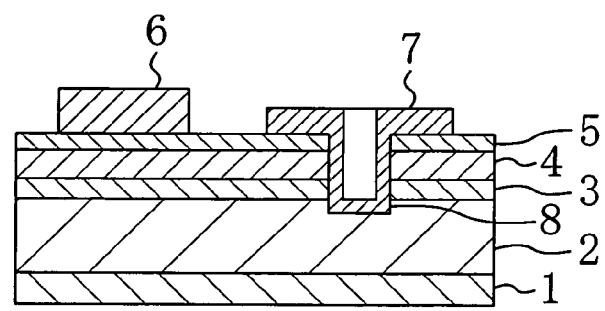

FIGS. 1A and 1B show the structure of a Schottky barrier diode (SBD) of Embodiment 1 of the invention, and specifically, FIG. 1A is a plan view thereof and FIG. 1B is a cross-sectional view thereof taken on line Ib-Ib of FIG. 1A.

As shown in FIG. 1B, a buffer layer 3 of aluminum nitride (AlN) with a thickness of 100 nm is formed on a conductive n-type silicon ($n^+$-Si) substrate 2. The buffer layer 3 has very high resistance because it includes a large number of crystal defects derived from a difference in the lattice constant between the crystal of the buffer layer 3 and the crystal of the $n^+$-Si substrate 2.

A first semiconductor layer 4 of undoped gallium nitride (GaN) is formed on the buffer layer 3, and a second semiconductor layer 5 of undoped aluminum gallium nitride ($Al_{0.26}Ga_{0.74}N$) is deposited on the first semiconductor layer 4 by metal organic chemical vapor deposition (MOCVD). On an interface in the first semiconductor layer 4 between the first semiconductor layer 4 and the second semiconductor layer 5, a two-dimensional electron gas with a high concentration of approximately $1 \times 10^{13}$ $cm^{-2}$ is present due to piezo polarization and spontaneous polarization.

A Schottky electrode (anode) 6 composed of successively stacked nickel (Ni) with a thickness of 50 nm and gold (Au) with a thickness of 200 nm and an ohmic electrode (cathode) 7 composed of successively stacked titanium (Ti) with a thickness of 10 nm, aluminum (Al) with a thickness of 200 nm, titanium (Ti) with a thickness of 50 nm and gold (Au) with a thickness of 500 nm are formed on the second semiconductor layer 5 to be spaced from each other.

A via 8 is formed so as to penetrate through the second semiconductor layer 5, the first semiconductor layer 4 and the buffer layer 3 and reach the $n^+$-Si substrate 2, and thus, the ohmic electrode 7 and the $n^+$-Si substrate 2 are electrically connected to each other. A back face electrode 1 composed of chromium (Cr) with a thickness of 100 nm and gold (Au) with a thickness of 2000 nm successively stacked in this order from the side of the $n^+$-Si substrate 2 is formed on the back face of the $n^+$-Si substrate 2, and the ohmic electrode 7 and the back face electrode 1 are electrically connected to each other through the via 8 and the $n^+$-Si substrate 2. Although the via 8 has a structure in which the bottom and the inner wall of a via hole are covered with a metal in this embodiment, the same effect can be attained also when it has a structure in which a via hole is completely filled with a metal.

When a forward bias voltage of, for example, approximately +1.5 V is applied between the Schottky electrode 6 and the back face electrode 1 of the SBD of this embodiment, a current flows from the Schottky electrode 6 to the ohmic electrode 7 owing to the 2DEG formed on the interface between the first semiconductor layer 4 and the second semiconductor layer 5. A current flows from the ohmic electrode 7 to the $n^+$-Si substrate 2 through the via 8 and further to the back face electrode 1. Also, there is a current path where a current flows directly from the Schottky electrode 6 to the via 8. Since the via 8 penetrates through the buffer layer 3, no current flows through the buffer layer 3 with high resistance, and hence, the on resistance is never increased by the buffer layer 3 with high resistance.

On the other hand, in the case where a backward bias voltage is applied between the Schottky electrode 6 and the back face electrode 1, a depletion layer extends in portions of the first semiconductor layer 4 and the second semiconductor layer 5 disposed below the Schottky electrode 6, and hence, no current flows between the Schottky electrode 6 and the back face electrode 1.

In this manner, the SBD of this embodiment has a high breakdown voltage because it uses the nitride semiconductor layers, and in addition, the on resistance can be made small because it uses the 2DEG Furthermore, since the ohmic electrode 7 is drawn to the back face of the substrate 2, the occupied area of the SBD is not large.

Figure 2A:
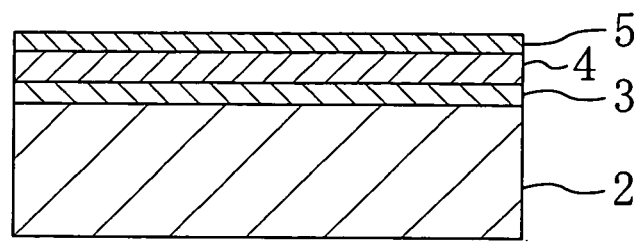
FIGS. 2A, 2B, 2C and 2D are cross-sectional views for showing procedures in fabrication process for the Schottky barrier diode of Embodiment 1.

Now, an exemplified method for fabricating the SBD of this embodiment will be described. FIGS. 2A through 2D are cross-sectional views for showing procedures performed in the fabrication of the SBD. First, as shown in FIG. 2A, a buffer layer 3 of AlN with a thickness of 100 nm is deposited on a $n^+$-Si substrate 2 with a thickness of 500 μm by the MOCVD. Then, undoped GaN with a thickness of 1.5 μm is deposited by the MOCVD as a first semiconductor layer 4 on the buffer layer 3, and undoped $Al_{0.26}Ga_{0.74}N$ with a thickness of 25 nm is further deposited by using a different type of gas, thereby forming a second semiconductor layer 5.

Figure 2B:
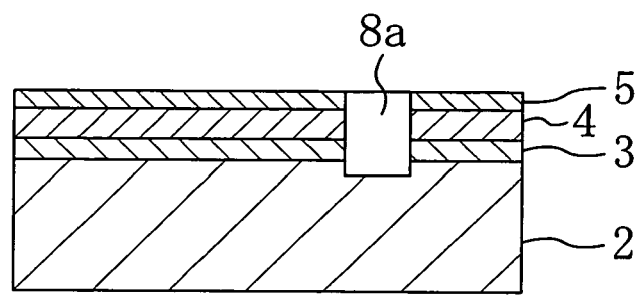

Next, as shown in FIG. 2B, after a given mask (not shown) is formed by using a resist on the second semiconductor layer 5, dry etching is performed by using a chlorine ($Cl_2$) gas as an etching gas, and thus, a via hole 8a with a depth of 1.7 μm penetrating through the second semiconductor layer 5, the first semiconductor layer 4 and the buffer layer 3 is formed so as to expose a part of the $n^+$-Si substrate 2 therein.

Figure 2C:
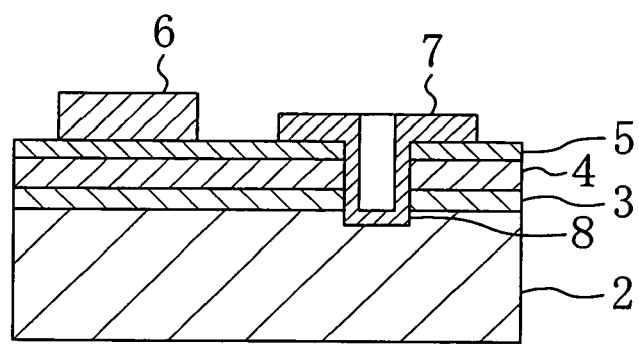

Then, as shown in FIG. 2C, Ti with a thickness of 10 nm, Al with a thickness of 200 nm, Ti with a thickness of 50 nm and Au with a thickness of 500 nm are successively deposited in this order within the via hole 8a and on a portion of the second semiconductor layer 5 disposed around the via hole 8a, lift-off is performed, and annealing is carried out at a temperature of 600° C., thereby simultaneously forming an ohmic electrode 7 and a via 8. In this case, the Au deposited as an upper layer of the ohmic electrode 7 may be thicker for avoiding occurrence of breaking of the Au film on a step formed on the bottom of the via hole 8a or the surface portion of the second semiconductor layer 5. Also, instead of the deposition and the lift-off, a plating method in which a thick film can be easily formed may be employed for forming the upper metal film of the via 8 and the ohmic electrode 7. Alternatively, the ohmic electrode 7 and the via 8 may be individually formed so as to connect them to each other through an interconnect after the formation. Subsequently, after depositing Ni with a thickness of 50 nm and Au with a thickness of 200 nm successively on the second semiconductor layer 5, the lift-off is performed and the annealing is carried out, thereby forming a Schottky electrode 6.

Figure 2D:
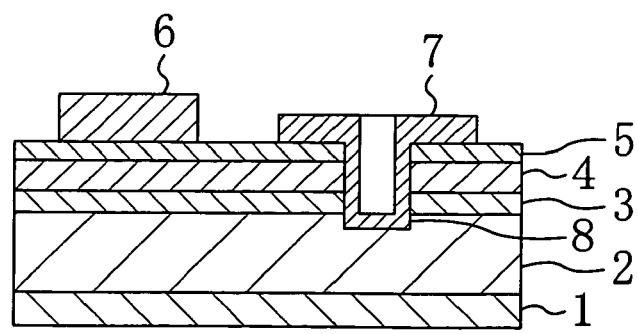

Next, as shown in FIG. 2D, the $n^+$-Si substrate 2 is polished on its back face into a thickness of 100 μm, and thereafter, Cr with a thickness of 100 nm and Au with a thickness of 2000 nm are successively deposited on the polished back face, thereby forming a back face electrode 1.

Although a combination of GaN and $Al_{0.26}Ga_{0.74}N$ is used as the first semiconductor layer 4 and the second semiconductor layer 5 in this embodiment, the composition ratio of Al may be arbitrarily modified as far as the two-dimensional electron gas can be formed on the interface between the first semiconductor layer 4 and the second semiconductor layer 5. Although the second semiconductor layer 5 is undoped in this embodiment, it may be doped to have n-type conductivity. Furthermore, a combination of GaAs and AlGaAs, a combination of InGaAs and AlGaAs, a combination InGaAs and InAlAs, a combination of InGaAs and InP or the like may be employed for the first semiconductor layer 4 and the second semiconductor layer 5.

Although the back face electrode 1 is formed after polishing the $n^+$-Si substrate 2 for reducing a resistance component of the SBD and improving the heat dissipation in this embodiment, the back face electrode 1 may be directly formed without polishing the $n^+$-Si substrate 2. Also, the thicknesses of the semiconductor layers and the like described in this embodiment may be arbitrarily changed in accordance with the characteristics of the SBD to be fabricated.

Modification 1 of Embodiment 1

Figure 3:
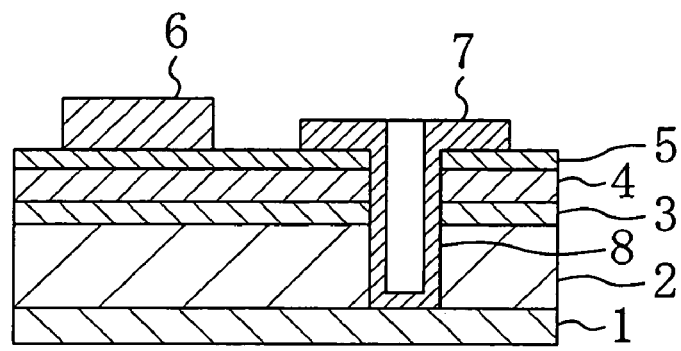
FIG. 3 is a cross-sectional view of a Schottky barrier diode according to Modification 1 of Embodiment 1 of the invention.

FIG. 3 shows the structure of an SBD according to Modification 1 of Embodiment 1 of the invention. In FIG. 3, like reference numerals are used to refer to like elements shown in FIGS. 1A and 1B so as to omit the description. As shown in FIG. 3, the SBD of this modification includes a via 8 penetrating through a substrate 2, and an ohmic electrode 7 and a back face electrode 1 are directly electrically connected to each other through the via 8.

Although it is necessary to form a via hole penetrating through the substrate 2 in the SBD of this modification, the on resistance can be further lowered than in the SBD of Embodiment 1 because no current flows in the substrate 2.

Modification 2 of Embodiment 1

Figure 4:
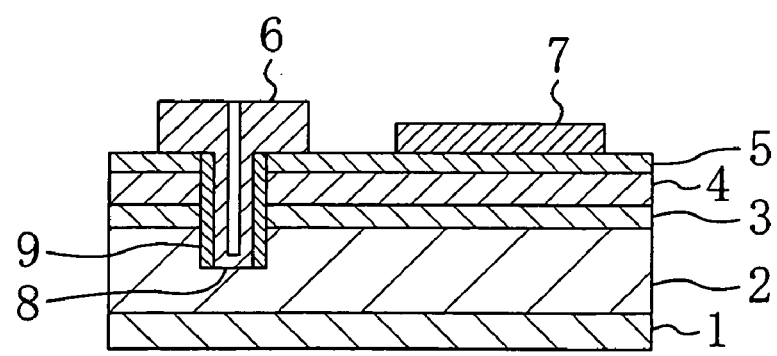
FIG. 4 is a cross-sectional view of a Schottky barrier diode according to Modification 2 of Embodiment 1 of the invention.

FIG. 4 shows the structure of an SBD according to Modification 2 of Embodiment 1 of the invention. In FIG. 4, like reference numerals are used to refer to like elements shown in FIGS. 1A and 1B so as to omit the description. As shown in FIG. 4, the SBD of this modification includes a Schottky electrode 6 connected to a substrate 2 through a via 8, and the Schottky electrode 6 is drawn to the back face. Also, an insulating film 9 of silicon nitride (SiN) is formed on the inner wall of a via hole 8a for preventing electric short-circuit between the via 8 and the 2DEG.

Since the Schottky electrode 6 is connected to the back face electrode in the SBD of this modification, when a backward bias voltage is applied, a depletion layer extends not only from the Schottky electrode 6 but also from the substrate 2, and hence, the electric field concentration can be avoided, resulting in increasing the breakdown voltage of the SBD.

Embodiment 2

Figure 5A:
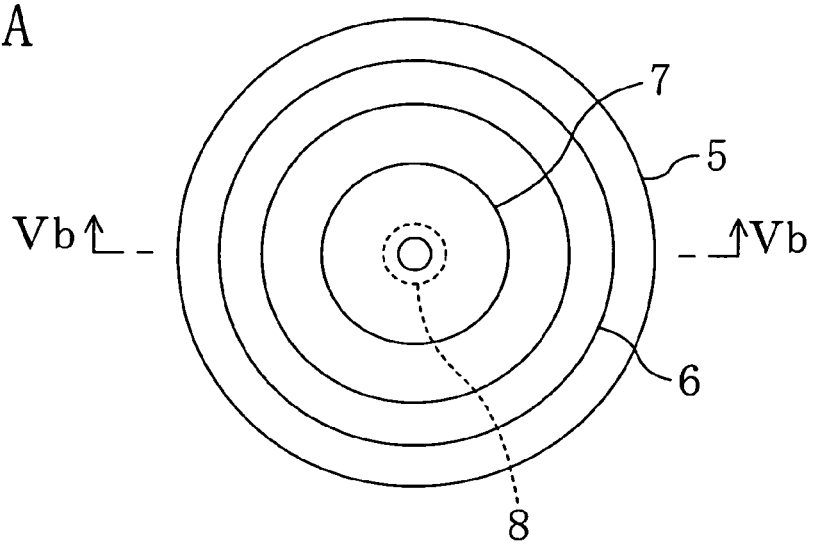
Figure 5B:
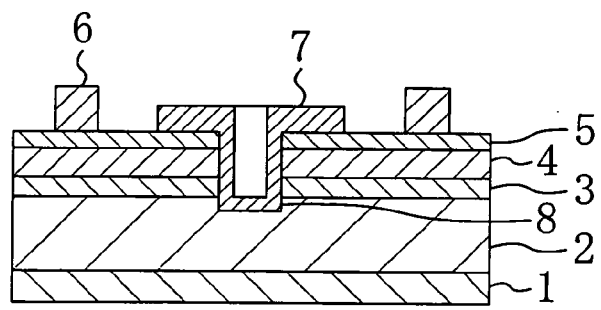

An SBD according to Embodiment 2 of the invention will now be described with reference to the accompanying drawings. FIGS. 5A and 5B show the SBD of this embodiment, and specifically, FIG. 5A is a plan view thereof and FIG. 5B is a cross-sectional view thereof taken on line Vb-Vb of FIG. 5A. In FIGS. 5A and 5B, like reference numerals are used to refer to like elements shown in FIGS. 1A and 1B so as to omit the description.

As shown in FIG. 5A, a Schottky electrode 6 is formed along an outer circumference of a region in the shape of a circle in the plan view surrounding an ohmic electrode 7 in the SBD of this embodiment. In an SBD utilizing a two-dimensional electron gas, a forward current flows between a Schottky electrode and an ohmic electrode in parallel to a substrate. Accordingly, in order to allow a large current to flow in the SBD, it is necessary to elongate an opposing portion between the Schottky electrode 6 and the ohmic electrode 7 as much as possible.

In the SBD of this embodiment, the Schottky electrode 6 in a ring shape is formed so as to surround and be spaced from the ohmic electrode 7 in a circular shape provided at the center. Accordingly, the length of the opposing portion between the ohmic electrode 7 and the Schottky electrode 6 is maximum, and hence, a current that can be allowed to flow in the SBD can be increased. Also, since the Schottky electrode is in the ring shape, the electric field concentration is minimally caused and the breakdown voltage is increased.

Figure 6A:
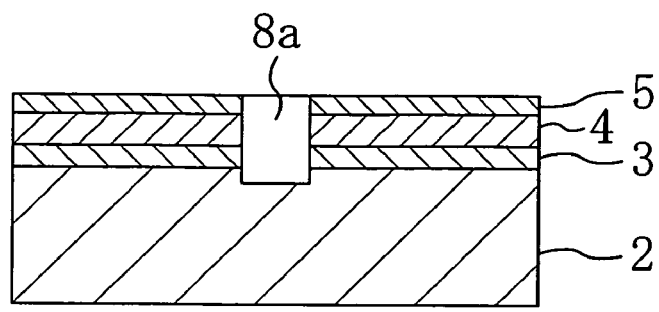
FIGS. 6A, 6B and 6C are cross-sectional views for showing procedures in fabrication process for the Schottky barrier diode of Embodiment 2.
Figure 6B:
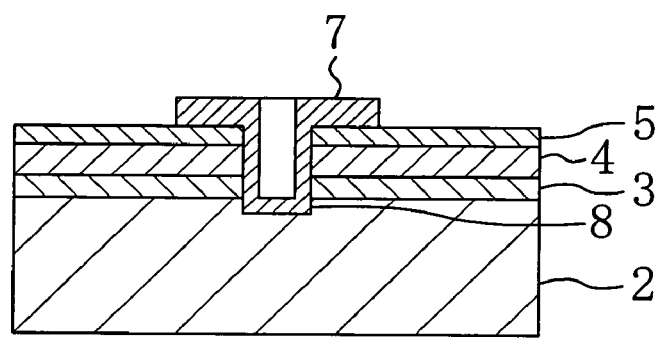
Figure 6C:
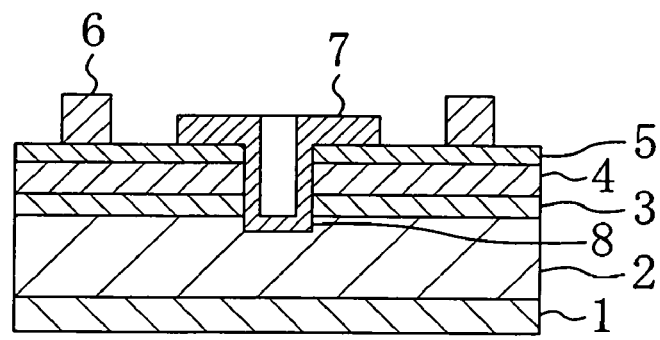

Now, a method for fabricating the SBD of this embodiment will be described. FIGS. 6A through 6C are cross-sectional views of the SBD of this embodiment in respective procedures performed in the fabrication. It is noted that procedures up to the formation of a second semiconductor layer 5 shown in FIG. 6A are the same as those of Embodiment 1 and hence the description is omitted.

As shown in FIG. 6A, a via hole 8a with a depth of 1.7 μm and a diameter of 10 μm is formed through the second semiconductor layer 5, a first semiconductor layer 4 and a buffer layer 3 by dry etching.

Next, as shown in FIG. 6B, Ti with a thickness of 10 nm, Al with a thickness of 200 nm, Ti with a thickness of 50 nm and Au with a thickness of 500 nm are successively deposited within the via hole 8a and on a portion of the second semiconductor layer 5 disposed around the via hole 8a, the lift-off is performed, and the annealing is carried out at a temperature of 600° C., thereby forming an ohmic electrode 7 with a circular contour and a via 8.

Then, as shown in FIG. 6C, Ni with a thickness of 50 nm and Au with a thickness of 200 nm are successively deposited and the lift-off is performed, thereby forming a Schottky electrode 6. At this point, when a two-layered resist in which a resist of a lower layer is easily regressed from a resist of an upper layer is used, the lift-off can be easily performed even if the Schottky electrode 6 is in a completely closed shape, and therefore, the ring-shaped Schottky electrode 6 surrounding the ohmic electrode 7 can be thus formed. Subsequently, a back face electrode 1 is formed on the back face of an n⁺-Si substrate 2 in the same manner as in Embodiment 1.

In order to increase the current that can be allowed to flow in the SBD, it is necessary to elongate the length of a portion of the Schottky electrode 6 opposing the ohmic electrode 7. In a general SBD in which a Schottky electrode and an ohmic electrode both in a linear shape are disposed in parallel, it is necessary to increase the length of the ohmic electrode for increasing the opposing length of the Schottky electrode, and hence, the occupied area of the whole SBD is increased. In the SBD of this embodiment, however, since the Schottky electrode 6 surrounds the ohmic electrode 7 in a ring shape, even when the ohmic electrode 7 is small, the opposing length of the Schottky electrode 6 can be long. Accordingly, a compact SBD capable of dealing with a large current can be realized.

Although the Schottky electrode 6 is in the ring shape surrounding the ohmic electrode 7 in this embodiment, the shape of the contour of the Schottky electrode 6 may be a square, a hexagon or the like as far as it surrounds the ohmic electrode 7. Also, the shape of the inner circumference and the shape of the out circumference of the Schottky electrode 6 may be the same or different. However, for making a distance between the Schottky electrode 6 and the ohmic electrode 7 uniform as far as possible, the plan shape of the inner circumference of the Schottky electrode 6 and the plan shape of the ohmic electrode 7 are preferably similar to each other.

Furthermore, although the ohmic electrode 7 is drawn to the back face in this embodiment, the Schottky electrode 6 may be drawn to the back face in the same manner as in Modification 2 of Embodiment 1.

Modification of Embodiment 2

Figure 7A:
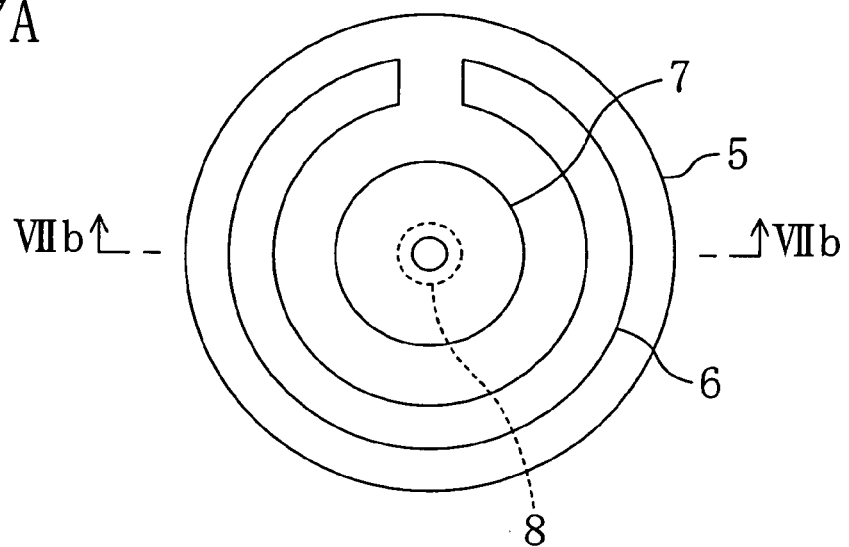
Figure 7B:
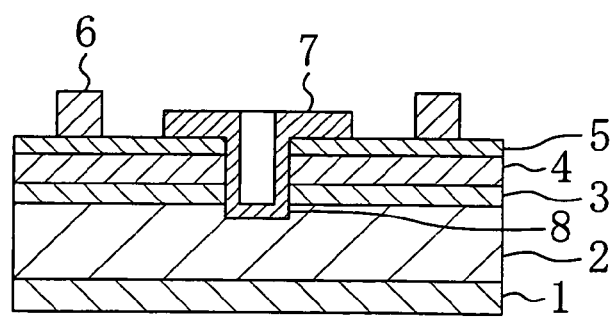

FIGS. 7A and 7B show an SBD according to a modification of Embodiment 2 of the invention, and specifically, FIG. 7A is a plan view thereof and FIG. 7B is a cross-sectional view thereof taken on line VIIb-VIIb of FIG. 7A. In FIGS. 7A and 7B, like reference numerals are used to refer to like elements shown in FIGS. 5A and 5B.

As shown in FIGS. 7A and 7B, in the SBD of this modification, a Schottky electrode 6 is not in a ring shape completely surrounding an ohmic electrode 7 as in Embodiment 2 but has a cut portion.

In the case where the Schottky electrode 6 has a cut portion in this manner, although the opposing portion between the ohmic electrode 7 and the Schottky electrode 6 is reduced, the Schottky electrode 6 can be easily formed by the lift-off using a one-layer resist without using a two-layered resist as that used in Embodiment 2.

Embodiment 3

Figure 8:
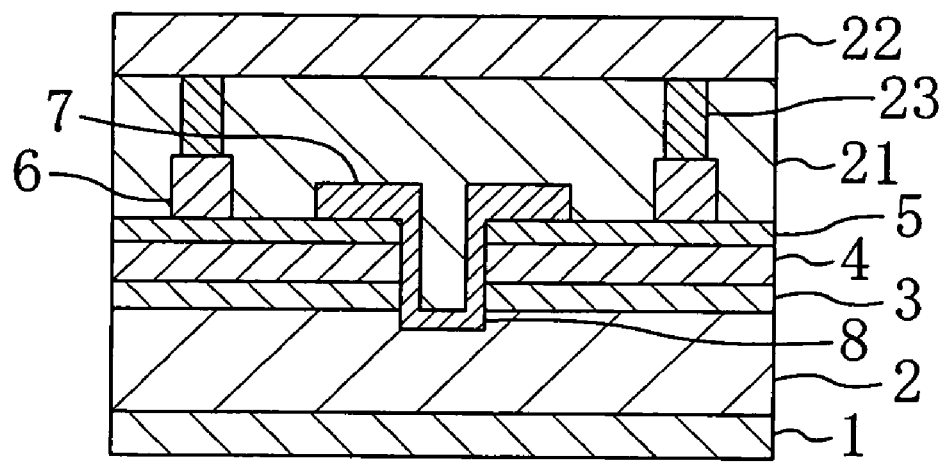
FIG. 8 is a cross-sectional view of a Schottky barrier diode according to Embodiment 3 of the invention.

An SBD according to Embodiment 3 of the invention will now be described with reference to the accompanying drawings. FIG. 8 is a cross-sectional view of the SBD of this embodiment. In FIG. 8, like reference numerals are used to refer to like elements shown in FIGS. 5A and 5B so as to omit the description. As shown in FIG. 8, in the SBD of this embodiment having a similar structure to that described in Embodiment 2, an insulating film 21 of benzocyclobutene (BCB) with a thickness of 3 μm is formed on a second semiconductor layer 5 so as to cover a Schottky electrode 6 and an ohmic electrode 7. Also, a drawing electrode 22 composed of titanium (Ti) with a thickness of 150 nm and gold (Au) with a thickness of 2 μm is formed on the insulating film 21, and the drawing electrode 22 and the Schottky electrode 6 are electrically connected to each other through a via 23 penetrating through the insulating film 21.

Figure 9A:
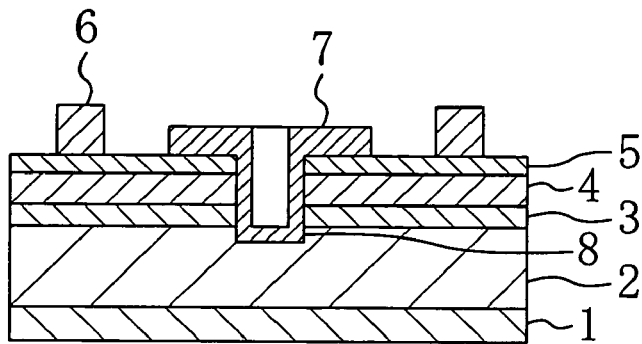
FIGS. 9A, 9B and 9C are cross-sectional views for showing procedures in fabrication process for the Schottky barrier diode of Embodiment 3.
Figure 9B:
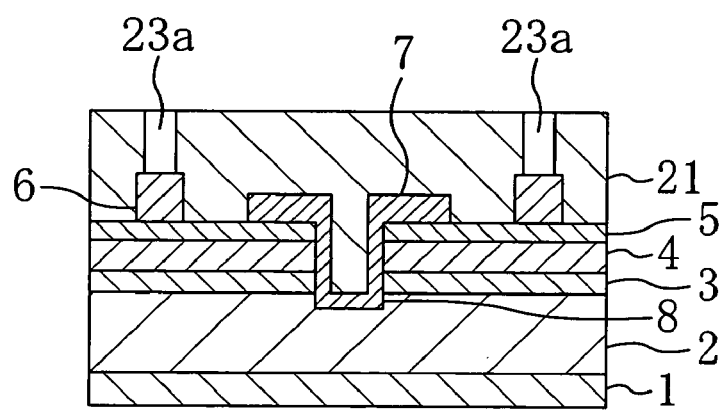
Figure 9C:
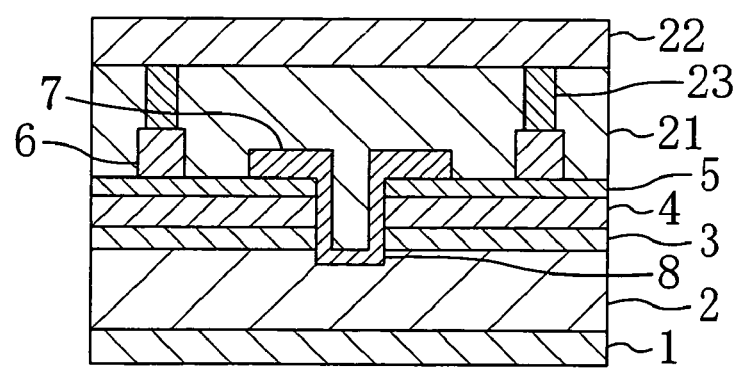

Now, an exemplified method for fabricating the SBD of this embodiment will be described. FIGS. 9A through 9C are cross-sectional views of the SBD of this embodiment in respective procedures performed in the fabrication. It is noted that procedures up to the formation of a back face electrode 1 shown in FIG. 9A are the same as those of Embodiment 2 and hence the description is omitted.

First, as shown in FIG. 9A, after forming an SBD having the same structure as that of Embodiment 2, BCB with a thickness of 3 μm is formed as an insulating film 21 on a second semiconductor layer 5 by spin coating and baking performed thereafter. Next, as shown in FIG. 9B, a given mask is formed by using a resist on the insulating film 21 and the dry etching is performed, thereby forming a via hole 23a penetrating through the insulating film 21 so as to expose the Schottky electrode 6 therein. Next, titanium (Ti) with a thickness of 150 nm and gold (Au) with a thickness of 200 nm are successively deposited over the insulating film 21, these layers are patterned by using a resist, and the resultant pattern is selectively plated with gold with a thickness of 2 μm. Then, after removing the resist, unnecessary portions of the Ti and Au are removed by wet etching, thereby simultaneously forming a via 23 and a drawing electrode 22 as shown in FIG. 9C.

In the SBD of this embodiment, since the drawing electrode 22 can be used as a bonding pad, the chip area of the SBD can be reduced, and hence the cost can be advantageously reduced. Also, since the length of an interconnect drawn from the Schottky electrode 6 is short, the on resistance can be effectively lowered. Furthermore, since the electric field formed from the ohmic electrode 7 is applied also to the direction of the drawing electrode 22, the electric field formed between the ohmic electrode 7 and the Schottky electrode 6 is dispersed, resulting in largely increasing the breakdown voltage of the SBD. This derives from the same effect as that attained in a field plate electrode generally used in an FET.

The BCB film used as the insulating film may be replaced with a film of polyimide, silicon oxide ($SiO_2$) or silicon nitride (SiN) as far as the film has a thickness for attaining a desired breakdown voltage. Also, the thickness of the insulating film is selected depending upon the desired breakdown voltage, the size of the device and the like.

Although the drawing electrode is additionally provided to the SBD of Embodiment 2 in this embodiment, a drawing electrode may be similarly provided to the SBD of Embodiment 1 or the like.

Embodiment 4

Figure 10:
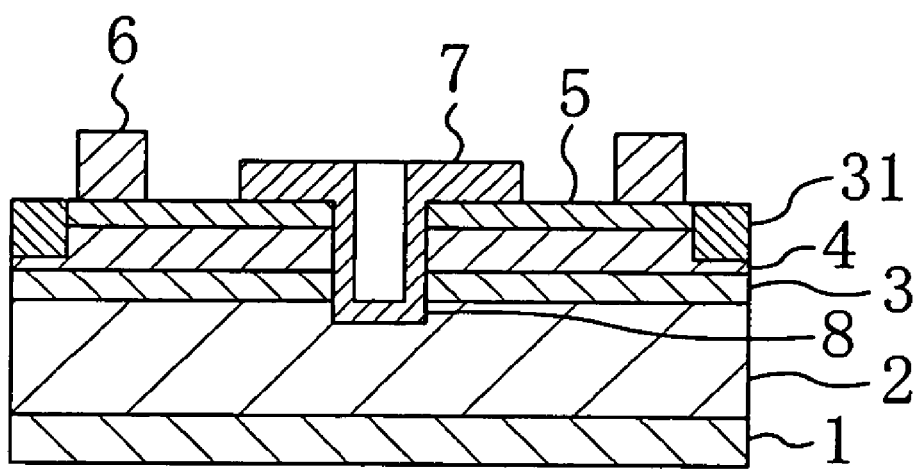
FIG. 10 is a cross-sectional view of a Schottky barrier diode according to Embodiment 4 of the invention.

An SBD according to Embodiment 4 of the invention will now be described with reference to the accompanying drawings. FIG. 10 is a cross-sectional view of the SBD of this embodiment. In FIG. 10, like reference numerals are used to refer to like elements shown in FIGS. 5A and 5B so as to omit the description. As shown in FIG. 10, the SBD of this embodiment includes a high-resistance region 31 surrounding the SBD outside the Schottky electrode 6 of the SBD of Embodiment 2.

Figure 11A:
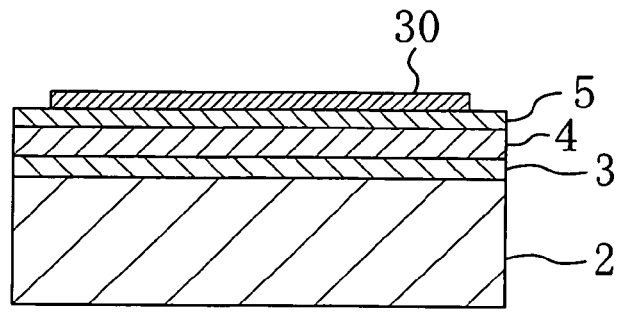
FIGS. 11A, 11B, 11C and 11D are cross-sectional views for showing procedures in fabrication process for the Schottky barrier diode of Embodiment 4.

Now, an exemplified method for fabricating the SBD of this embodiment will be described. FIGS. 11A through 11D are cross-sectional views of the SBD of this embodiment in respective procedures performed in the fabrication. It is noted that the procedures up to formation of a second semiconductor layer 5 shown in FIG. 11A are the same as those of Embodiment 2 and hence the description is omitted.

Figure 11B:
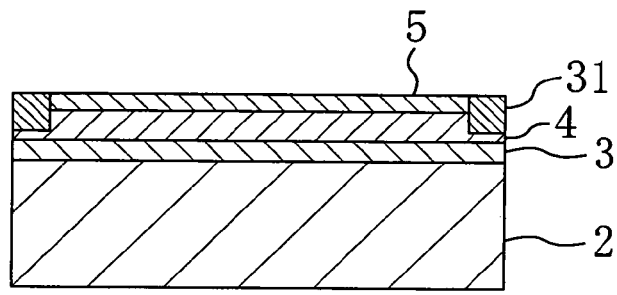
Figure 11C:
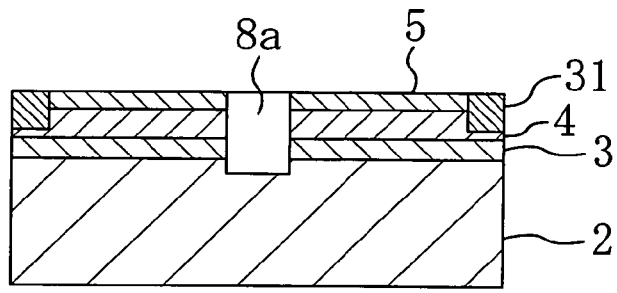
Figure 11D:
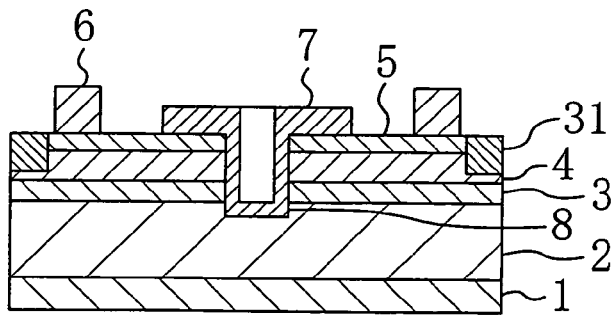

As shown in FIG. 11A, after forming the second semiconductor layer 5, a region where a Schottky electrode 6 is to be formed and its inside portion are masked with a silicon film 30. Next, as shown in FIG. 11B, annealing is performed in an oxygen atmosphere at a temperature of 1000° C. for 20 minutes, thereby forming a high-resistance region 31 by thermally oxidizing given portions of the second semiconductor layer 5 and a first semiconductor layer 4. Then, as shown in FIG. 11C, a via hole 8a is formed by the dry etching in the same manner as in Embodiment 2. Subsequently, a via 8 and an ohmic electrode 7 are simultaneously formed, and thereafter, annealing is performed, and a Schottky electrode 6 and a back face electrode 1 are formed.

The SBD of this embodiment includes the high-resistance region 31 surrounding the SBD outside the Schottky electrode 6. Therefore, a depletion layer formed in applying a backward bias voltage to the Schottky electrode 6 can be prevented from extending to an edge portion with poor crystallinity of the SBD, resulting in preventing lowering of the breakdown voltage.

Figure 12:
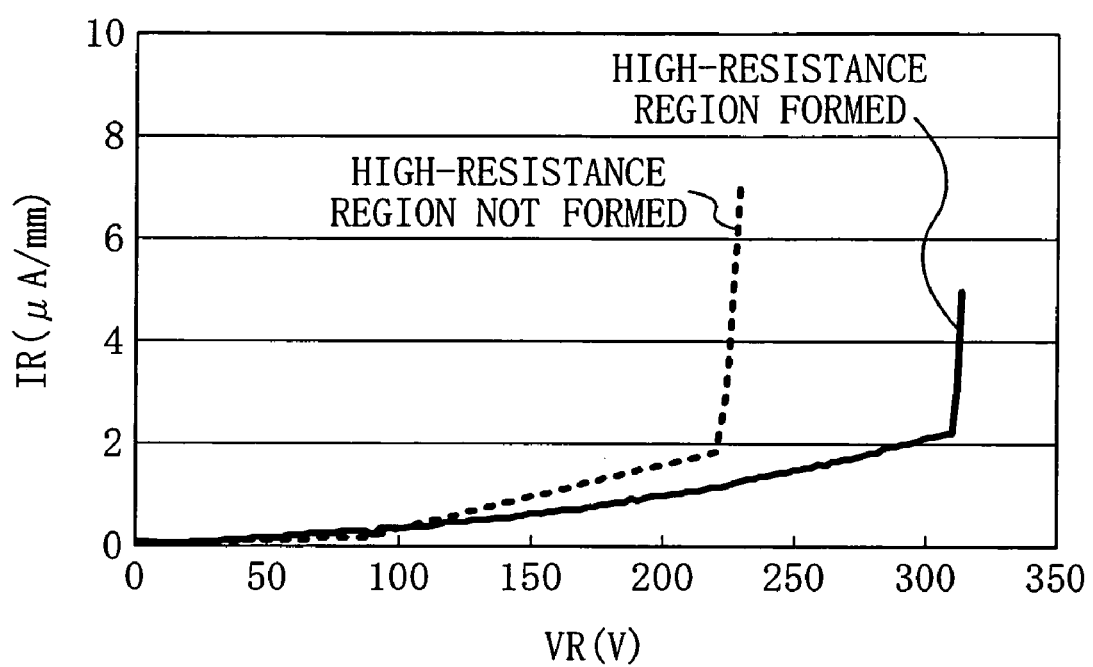
FIG. 12 is a graph for showing a breakdown voltage of the Schottky barrier diode of Embodiment 4.

FIG. 12 is a graph of a current-voltage characteristic obtained in applying a positive voltage to the ohmic electrode, and this graph shows change of the breakdown voltage caused by forming a high-resistance region. In FIG. 12, the abscissa indicates the bias voltage VR and the ordinate indicates the bias current IR. The breakdown voltage of an SBD not provided with a high-resistance region is 220 V as shown with a broken line in FIG. 12. On the other hand, the breakdown voltage of an SBD provided with a high-resistance region is 310 V as shown with a sold line in FIG. 12, and thus, the breakdown voltage is increased by 90 V by providing a high-resistance region.

In this embodiment, the high-resistance region has resistance of $1\times10^4$ Ωcm or more and preferably of $1\times10^6$ Ωcm or more. Also, ion implantation may be employed instead of the annealing. In this case, nitrogen ions are implanted, for example, at an acceleration voltage of 100 keV and at a dose of $4\times10^{13}$ $cm^{-2}$.

Furthermore, the SBD of this embodiment may be provided with a drawing electrode in the same manner as in Embodiment 3.

Embodiment 5

Figure 13A:
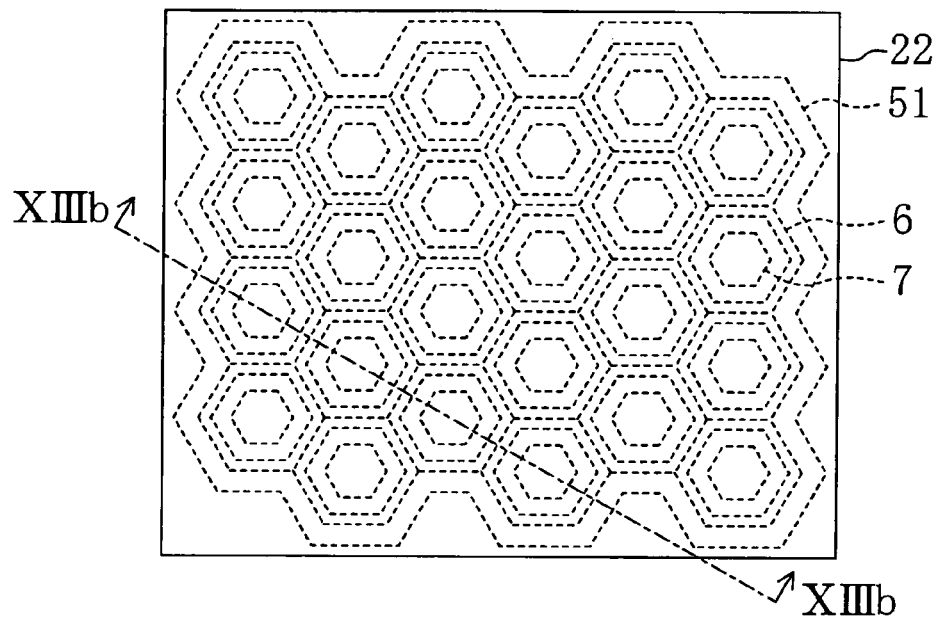
Figure 13B:
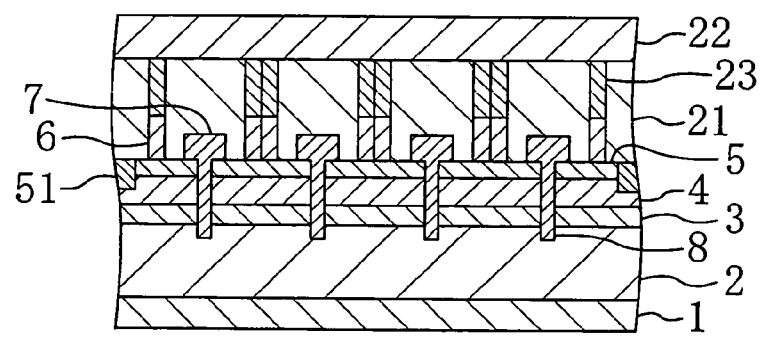

A diode array according to Embodiment 5 of the invention will now be described with reference to the accompanying drawings. FIGS. 13A and 13B show the diode array of this embodiment, and specifically, FIG. 13A is a plan view thereof and FIG. 13B is a cross-sectional view thereof taken on line XIIIb-XIIIb of FIG. 13A.

As shown in FIGS. 13A and 13B, in the diode array of this embodiment, SBDs each of which includes a Schottky electrode 6 with a hexagonal contour in the plan view are arranged with their Schottky electrodes 6 in contact with one another in six columns and four rows.

An ohmic electrode 7 of each SBD is electrically connected to a $n^+$-Si substrate 2 through a via 8 penetrating through a second semiconductor layer 5, a first semiconductor layer 4 and a buffer layer 3, and is further electrically connected to a back face electrode 1 provided on the back face of the $n^+$-Si substrate 2. The via 8 may be in a structure in which the bottom and the inner wall of an opening corresponding to a via hole is covered with a metal or a structure in which a via hole is filled with a metal.

An insulating film 21 of BCB is formed on the second semiconductor layer 5 so as to cover the respective Schottky electrodes 6 and ohmic electrodes 7, and a drawing electrode 22 is formed on the insulating film 21. Each Schottky electrode 6 is connected to the drawing electrode 22 through a via 23 penetrating through the insulating film 21. Accordingly, the respective Schottky electrodes 6 and the respective ohmic electrodes 7 are connected to one another in parallel, and all the SBDs included in the diode array are connected to one another in parallel.

Furthermore, a high-resistance region (isolation region) 51 is formed around the diode array, so as to prevent the breakdown voltage of the diode array from lowering by preventing a depletion layer from extending to edge portions with poor crystallinity of the semiconductor layers.

In general, a current value of a current that can be allowed to flow per 1 mm of a Schottky electrode is approximately 250 mA. Accordingly, in an SBD of 10 A, the Schottky electrode should have a length of approximately 40 mm, and the diameter of the SBD for satisfying this condition is approximately 12 mm. On the other hand, when a diode array is formed by two-dimensionally arranging SBDs, SBDs each having a diameter of 40 μm are arranged in twenty-two columns and fifteen rows, which can be disposed in a region of 600 μm by 880 μm.

Furthermore, when the Schottky electrode 6 of each SBD included in a diode array is in a rectangular or hexagonal shape in the plan view, the SBDs can be two-dimensionally arranged without leaving any space between them, and thus, the occupied area can be further reduced. For example, in the case where a diode array of 10 A is formed by arranging SBDs each including a Schottky electrode 6 with a hexagonal contour in the plan view in a matrix of fifteen by twenty-two, the length of each side of the SBD is approximately 20 μm, and such a diode array can be disposed in a region of approximately 520 μm×660 μm.

Figure 14:
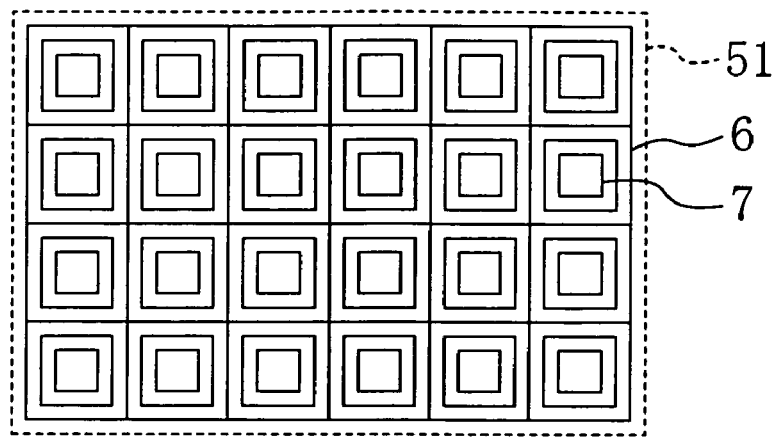
FIG. 14 is a plan view for showing an exemplified plane arrangement of the diode array of Embodiment 5.
Figure 15:
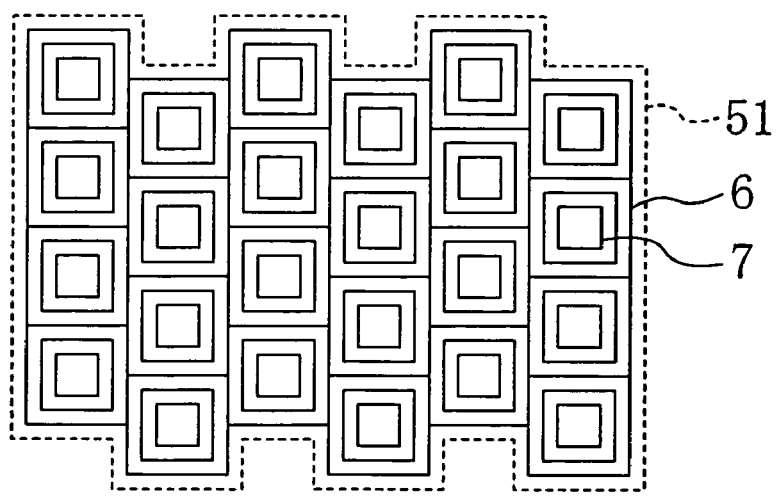
FIG. 15 is a plan view for showing another exemplified plane arrangement of the diode array of Embodiment 5.

In the case where the contour of the Schottky electrode 6 is in a rectangular shape in the plan view, SBDs can be arranged in a grid-like shape as shown in FIG. 14, and in this case, the contour around outermost SBDs is in a smooth shape, and hence, the chip area can be effectively used. Also, in the case where the contour of the Schottky electrode 6 is in a rectangular shape in the plan view, when SBDs arranged in adjacent columns are vertically shifted by a length corresponding to a half of the length of the SBD as shown in FIG. 15, a minimum distance between adjacent via holes is $2/\sqrt{3}$ times as long as that attained when the SBDs are arranged in a grid-like shape, and therefore, heat radiation caused in an operation of the SBDs can be improved.

Figure 16A:
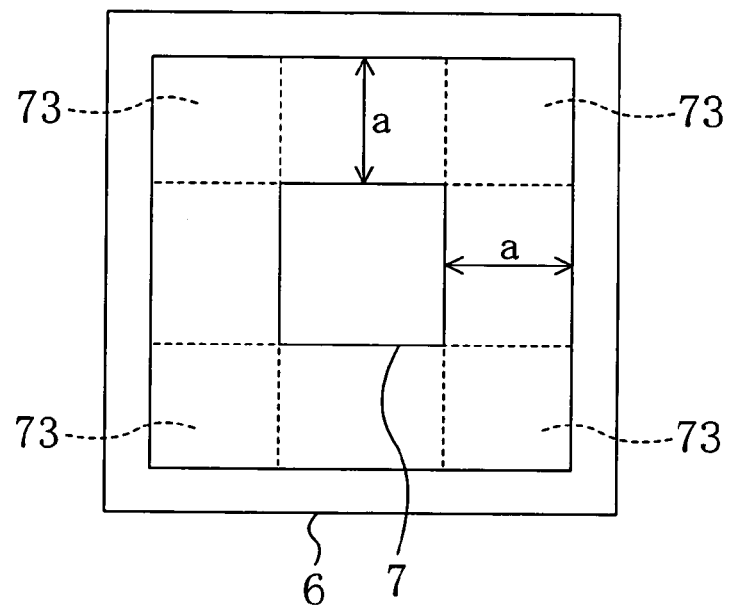
FIGS. 16A and 16B are plan views for showing an operation ununiform region caused in a Schottky barrier diode included in the diode array of Embodiment 5.

In the case where the contour of the Schottky electrode 6 is in a rectangular shape in the plan view, assuming that the minimum distance between the Schottky electrode 6 and the ohmic electrode 7 is a distance a as shown in FIG. 16A, a distance between regions 73 is larger than the distance a. As a result, electric operations such as a current distribution attained in applying a forward bias voltage and extension of a depletion layer attained in applying a backward bias voltage are ununiform in the region 73 as compared with those attained in a region where the distance between the electrodes is the distance a. The total area of the regions 73 where the electric operations are ununiform is $4a^2$ because there are four squares each having a side with a length a.

Figure 16B:
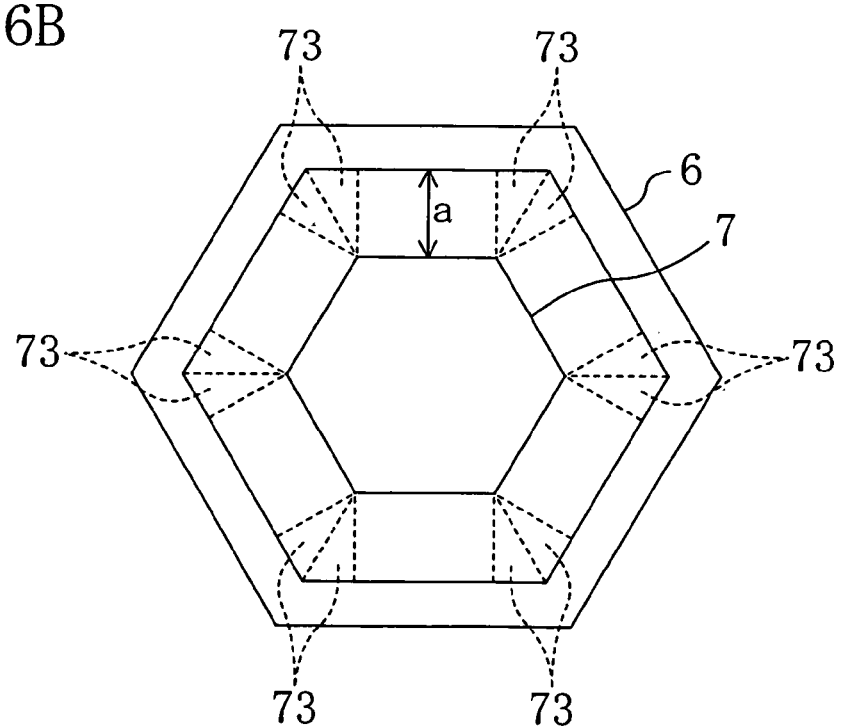
Figure 17:
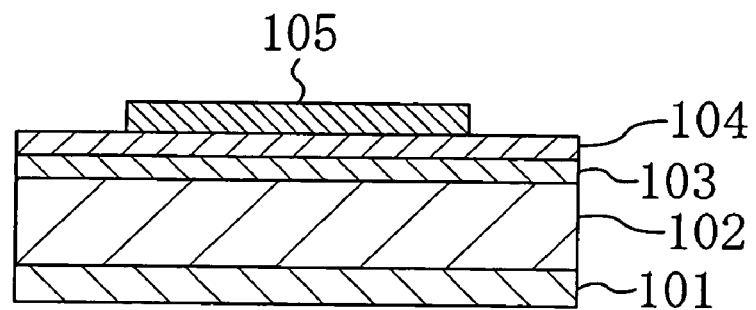
FIG. 17 is a cross-sectional view of a Schottky barrier diode according to Conventional Example 1.
Figure 18:
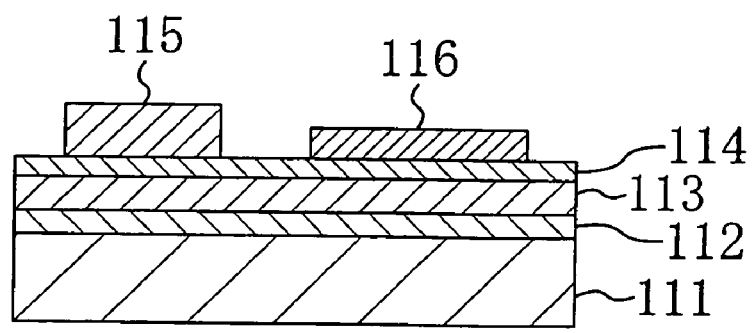
FIG. 18 is a cross-sectional view of a Schottky barrier diode according to Conventional Example 2.

On the other hand, in the case where the contour of the Schottky electrode 6 is in a hexagonal shape in the plan view, regions 73 away from each other by a distance longer than the minimum distance a between the Schottky electrode 6 and the ohmic electrode 7 are shown in FIG. 16B. The total area of the regions 73 where the electric operations are ununiform is approximately $3.46a^2$ because there are twelve right triangles each having a base with a length a and a height $a/\sqrt{3}$. In this manner, the ratio of the total area of the regions where the electric operations are ununiform is smaller and hence the SBDs can be more stably operated when the contour of the Schottky electrode is in a hexagonal shape in the plan view than when it is in a rectangular shape.

In the case where the contour of the Schottky electrode 6 is in a circular shape in the plan view, there is no region where the electric operations of the SBDs are ununiform. In this case, however, the SBDs cannot be two-dimensionally arranged without leaving any space between them, and therefore, the chip area cannot be efficiently used.

As described so far, in the Schottky barrier diode and the diode array of this invention, the breakdown voltage is high, the on resistance is low and the chip area is small. Accordingly, the invention is useful for a Schottky barrier diode and a diode array using a two-dimensional electron gas.

What is claimed is:
1. A Schottky barrier diode comprising:
a first semiconductor layer and a second semiconductor layer successively formed above a semiconductor substrate with a buffer layer disposed between said first and second semiconductor layers and said semiconductor substrate;
a Schottky electrode and an ohmic electrode spaced from each other and formed on said second semiconductor layer; and
a back face electrode formed on a back face of said semiconductor substrate,
wherein said ohmic electrode is electrically connected to said back face electrode through a via penetrating through at least said buffer layer, and
said Schottky electrode surrounds said ohmic electrode.
2. The Schottky barrier diode of claim 1, wherein said via does not penetrate through said semiconductor substrate.
3. The Schottky barrier diode of claim 1, wherein said ohmic electrode is in a circular shape in a plan view and a side of said Schottky electrode opposing said ohmic electrode is in a circular shape.
4. The Schottky barrier diode of claim 1, wherein said ohmic electrode is in a rectangular shape in a plan view and sides of said Schottky electrode opposing said ohmic electrode are in a rectangular shape.
5. The Schottky barrier diode of claim 1, wherein said ohmic electrode is in a hexagonal shape in a plan view and sides of said Schottky electrode opposing said ohmic electrode are in a hexagonal shape.
6. The Schottky barrier diode of claim 1, wherein a plane shape of an outer circumference of said Schottky electrode is similar to a plane shape of an inner circumference of said Schottky electrode.
7. The Schottky barrier diode of claim 1, wherein said Schottky electrode has at least one cut portion.
8. The Schottky barrier diode of claim 1, wherein
a high-resistance region surrounding said Schottky electrode and having higher resistance than said first semiconductor layer and said second semiconductor layer is formed on a side of said Schottky electrode not opposing said ohmic electrode, and
said high-resistance region is formed by thermally oxidizing given portions of said first semiconductor layer and said second semiconductor layer.
9. The Schottky barrier diode of claim 1, wherein said semiconductor substrate is made of silicon, silicon carbide or gallium nitride.
10. The Schottky barrier diode of claim 1, wherein each of said first semiconductor layer and said second semiconductor layer is made of a compound represented by a general formula, $In_aGa_bAl_cB_dN$, wherein $0 \leq a, b, c, d \leq 1$ and $a+b+c+d=1$, and said second semiconductor layer has a larger band gap than said first semiconductor layer.
11. The Schottky barrier diode of claim 1, wherein
a high-resistance region surrounding said Schottky electrode and having higher resistance than said first semiconductor layer and said second semiconductor layer is formed on a side of said Schottky electrode not opposing said ohmic electrode, and
said high-resistance region is formed by ion implantation.

12. The Schottky barrier diode of claim 1, wherein said drawing electrode and said Schottky electrode are electrically connected to each other through another via penetrating through said first insulating film.

13. The Schottky barrier diode of claim 1, further comprising:
a first insulating film formed on said Schottky electrode and said ohmic electrode; and
a drawing electrode drawn onto said first insulating film, wherein said Schottky electrode is electrically connected to said drawing electrode only through a metal.

14. The Schottky barrier diode of claim 13, wherein said drawing electrode covers said first insulating film above said ohmic electrode.

15. A diode array comprising a plurality of Schottky barrier diodes formed on one semiconductor substrate and connected to one another in parallel,
wherein said plurality of Schottky barrier diodes include:
a first semiconductor layer and a second semiconductor layer successively formed above said semiconductor substrate with a buffer layer disposed between said first and second semiconductor layers and said semiconductor substrate;
a plurality of electrode pairs each corresponding to a pair of a Schottky electrode and an ohmic electrode formed on said second semiconductor layer and spaced from each other;
a first insulating film formed on said second semiconductor layer for covering said plurality of electrode pairs;
a drawing electrode formed on said first insulating film; and
a back face electrode formed on a back face of said semiconductor substrate,
said ohmic electrode of each of said plurality of electrode pairs is electrically connected to said back face electrode through a via penetrating through at least said buffer layer,
said Schottky electrode of each of said plurality of electrode pairs is electrically connected to said drawing electrode, and
wherein said Schottky electrode surrounds said ohmic electrode in each of said plurality of electrode pairs.

16. The diode array of claim 15, wherein said ohmic electrode is in a circular shape in a plan view and a side of said Schottky electrode opposing said ohmic electrode is in a circular shape in each of said plurality of electrode pairs.

17. The diode array of claim 15, wherein said ohmic electrode is in a rectangular shape in a plan view and sides of said Schottky electrode opposing said ohmic electrode are in a rectangular shape in each of said plurality of electrode pairs.

18. The diode array of claim 15, wherein said ohmic electrode is in a hexagonal shape in a plan view and sides of said Schottky electrode opposing said ohmic electrode are in a hexagonal shape in each of said plurality of electrode pairs.

19. The diode array of claim 15, wherein a plane shape of an outer circumference of said Schottky electrode is similar to a plane shape of an inner circumference of said Schottky electrode in each of said plurality of electrode pairs.

20. The diode array of claim 15, wherein each Schottky electrode has at least one cut portion.

21. The diode array of claim 15, wherein adjacent ones of said plurality of Schottky barrier diodes are in contact with each other.

22. The diode array of claim 15, wherein
a region where said plurality of Schottky barrier diodes are disposed is surrounded with a high-resistance region having higher resistance than said first semiconductor layer and said second semiconductor layer, and
said high-resistance region is formed by thermally oxidizing given portions of said first semiconductor layer and said second semiconductor layer.

23. The diode array of claim 15, wherein said semiconductor substrate is made of silicon, silicon carbide or gallium nitride.

24. The diode array of claim 15, wherein each of said first semiconductor layer and said second semiconductor layer is made of a compound represented by a general formula, $In_a Ga_b Al_c B_d N$, wherein $0 \leq a, b, c, d \leq 1$ and $a+b+c+d=1$, and said second semiconductor layer has a larger band gap than said first semiconductor layer.

25. The diode array of claim 15,
wherein a high-resistance region surrounding said Schottky electrode and having higher resistance than said first semiconductor layer and said second semiconductor layer is formed on a side of said Schottky electrode not opposing said ohmic electrode, and
said high-resistance region is formed by ion implantation.

26. The diode array of claim 15, wherein said via does not penetrate through said semiconductor substrate.

27. The diode array of claim 15, wherein said drawing electrode covers said first insulating film above said ohmic electrode of each of said plurality of electrode pairs.

28. The diode array of claim 15, wherein said Schottky electrode of each of said plurality of electrode pairs is electrically connected to said drawing electrode only through a metal.

* * * * *